(12) United States Patent
Zhuang et al.

(10) Patent No.: US 10,708,392 B2
(45) Date of Patent: Jul. 7, 2020

(54) SYSTEM AND METHOD FOR COMPRESSION AND DECOMPRESSION OF DATA CONTAINING REDUNDANCIES

(71) Applicant: AppEx NETWORKS HOLDING LIMITED, Cupertino, CA (US)

(72) Inventors: Hao Zhuang, Sammamish, WA (US); Yongdong Wang, Cupertino, CA (US)

(73) Assignee: AppEx NETWORKS HOLDING LIMITED, Cupertino, CA (US)

(*) Notice: Subject to any disclaimer, the term of this patent is extended or adjusted under 35 U.S.C. 154(b) by 383 days.

(21) Appl. No.: 14/559,816

(22) Filed: Dec. 3, 2014

(65) Prior Publication Data

US 2015/0161156 A1 Jun. 11, 2015

Related U.S. Application Data

(60) Provisional application No. 61/913,295, filed on Dec. 7, 2013.

(51) Int. Cl.
| | |
|---|---|
| *H04L 29/06* | (2006.01) |
| *G06F 16/174* | (2019.01) |
| *H03M 7/30* | (2006.01) |

(52) U.S. Cl.
CPC .......... *H04L 69/04* (2013.01); *G06F 16/1752* (2019.01); *H03M 7/3084* (2013.01); *H03M 7/6011* (2013.01)

(58) Field of Classification Search
CPC .................................................. G06F 16/1752
USPC .............................................................. 707/693
See application file for complete search history.

(56) References Cited

U.S. PATENT DOCUMENTS

| | | | |
|---|---|---|---|
| 4,701,745 A | 10/1987 | Waterworth | |
| 7,098,815 B1* | 8/2006 | Samuels | H03M 7/30 341/51 |
| 2008/0224902 A1* | 9/2008 | Samuels | H03M 7/3084 341/51 |
| 2011/0179341 A1* | 7/2011 | Falls | H03M 7/3086 714/807 |

* cited by examiner

*Primary Examiner* — Mohsen Almani
(74) *Attorney, Agent, or Firm* — Sheppard Mullin Richter & Hampton LLP

(57) ABSTRACT

An apparatus and a computer-implemented method for processing data are disclosed. The apparatus comprises a memory device that stores first history data, and at least one processor configured to receive input data, determine a relationship between the first history data and one or more portions of the input data, generate one or more reference tokens reflecting the relationship, and transmit the one or more reference tokens to a recipient device.

12 Claims, 10 Drawing Sheets

350

| Chunk ID | Block Signature | Data Offset |
|---|---|---|
| 3003 | 1234 | 0 |
| 3003 | 5678 | 64 |
| 2999 | 1234 | 0 |
| 2999 | 5678 | 64 |

352 — Chunk ID
354 — Block Signature
356 — Data Offset

FIG. 3B

SYSTEM AND METHOD FOR COMPRESSION AND DECOMPRESSION OF DATA CONTAINING REDUNDANCIES

CROSS REFERENCE TO RELATED APPLICATIONS

This application claims the benefit of U.S. Provisional Application No. 61/913,295, filed Dec. 7, 2013, the content of which is hereby incorporated by reference in its entirety.

TECHNICAL FIELD

The present disclosure relates to a technical field of compression and decompression of data, and particular to data containing redundancies.

BACKGROUND

It is common to transfer large volume of data over a computer network, or between storage devices over an I/O (input/output) interface. For example, a user may transfer a whole home directory from a hard drive to a non-volatile memory device (e.g., a flash drive) to perform a periodic backup of the hard drive, or transfer a large document file over the Internet. The data transferred can include redundant data, i.e. data that the recipient already possesses. For example, in the case where the user is creating a periodic backup of the hard drive on the flash drive, the backup data to be transmitted to the flash drive typically contains data that already exists in the flash drive. Similarly, in the case where the user transfers the document file over the Internet, the user may be downloading the file from a network source (e.g., a server), modifying it, and uploading the file back to the network source. If the document file is not completely modified, common data can also exist between the version of the file uploaded and the version of the file downloaded. Transmitting redundant data that is stored in both the source and the destination leads to inefficient utilization of bandwidth of I/O interface and network. Existing compression and decompression methods fail to take advantage of such data redundancies, since locating redundant data over gigabytes to terabytes data storage is generally considered to be time-consuming and with low yield.

Hence, there is a need for a technique to search for redundant data with huge volume of data, in an efficient manner and with a high probability of locating the redundancies, which can minimize the transmission of redundant data and can improve the utilization of limited bandwidth of I/O interface and network.

SUMMARY OF THE DISCLOSURE

Additional aspects and advantages of embodiments of present disclosure will be given in part in the following descriptions, become apparent in part from the following descriptions, or be learned from the practice of the embodiments of the present disclosure.

According to some embodiments, an apparatus comprises a memory device that stores first history data, and at least one processor configured to receive input data, determine a relationship between the first history data and one or more portions of the input data, generate one or more reference tokens reflecting the relationship, and transmit the one or more reference tokens to a recipient device. In some embodiments, the reference tokens allow a reconstruction of the one or more portions of the input data at the recipient device. In some embodiments, responsive to determining that the first portion of the input data does not match with any portion of the first history data, the at least one processor is configured to transmit the first portion of the input data to the recipient device.

According to some embodiments, the first history data comprises one or more first data chunks, wherein each first data chunk is associated with one or more first signatures, wherein the one or more first data chunks include a working data chunk. In some embodiments, the determination of the relationship between the first history data and the one or more portions of the input data further includes associating one or more second signatures with the input data, and determining whether at least one of the first signatures associated with the working data chunk matches with at least one of the second signatures. In some embodiments, responsive to a determination that at least one of the first signatures of the working data chunk matches with at least one of the second signatures, the first signature that matches with the second signature being associated with a portion of the working data chunk and the second signature being associated with a portion of the input data, the at least one processor is further configured to determine that the associated portion of the working data chunk is identical to the associated portion of the input data, and determining information about a location and a size of the associated portion of the working data chunk, wherein a first reference token is generated to include the information about the location and the size of the associated portion of the working data chunk. In some embodiments, the reference token also includes an identifier associated with the working data chunk.

In some embodiments, the apparatus further comprises a data storage device storing one or more second data chunks, each second data chunk being associated with one or more third signatures. The at least one processor is further configured to, responsive to a determination that none of the first signatures matches with any of the second signatures, determine whether at least one of the third signatures matches with at least one of the second signatures; and if at least one of the third signatures matches with at least one of the second signatures, the at least one processor is further configured to acquire the second data chunk associated with the third signature that matches with the first signature from the data storage device to become the working history data chunk.

According to some embodiments, the working data chunk further includes one or more data blocks, wherein at least one of the first signatures is associated with at least one of the data blocks and with a first offset, the first offset reflecting the location of the at least one of the data blocks within the working data chunk. In some embodiments, the determination of the information about a location and a size of the associated portion of the working data chunk includes searching, within the working data chunk and in a forward direction and/or backward direction relative to the location reflected by the first offset, data that matches with one or more portions of the input data. In some embodiments, the at least one of the first signatures is generated from a plurality of sub-signatures, each sub-signature being generated from a portion of the at least one of the data blocks. In some embodiments, each of the first data chunks is associated with a timestamp, and wherein the working data chunk is designated based on the timestamp associated with the working data chunk.

According to some embodiments, a computer-implemented method for processing data comprises receiving input data, receiving first history data, determining a relationship between the first history data and one or more portions of the input data, generating one or more reference tokens reflecting the relationship, and transmitting the one or more reference tokens to a recipient device. In some embodiments, responsive to determining that the first portion of the input data does not match with any portion of the first history data, the method further comprises transmitting the first portion of the input data to the recipient device According to some embodiments, an apparatus comprises a memory device that stores history data, and at least one processor configured to receive input data, generate one or more reference tokens including information about at least a portion of history data that is associated with the input data, and transmit the one or more reference tokens and at least a portion of the input data that is not in the history data to a recipient device. In some embodiments, the information about the portion of the history data includes a location of the portion of the first history data and the size of the portion of the history data.

BRIEF DESCRIPTION OF THE DRAWINGS

Reference will now be made to the accompanying drawings showing example embodiments of the present application, and in which:

FIG. 3A-3C are block diagrams illustrating exemplary data structures for facilitating searching of history data according to embodiments of the present disclosure.

DETAILED DESCRIPTION

Reference will now be made in detail to the embodiments, the examples of which are illustrated in the accompanying drawings. Whenever possible, the same reference numbers will be used throughout the drawings to refer to the same or like parts.

The description of the embodiments is only exemplary, and is not intended to be limiting. The disclosure and claims use reference numbers "first," "second," and "third" for description purpose. A person having ordinary skill in the art should understand that they do not mean or refer to "the first," "the second," or "the third."

According to some embodiments, the operations, techniques, and/or components described herein can be implemented by an electronic device, which can include one or more special-purpose computing devices. The special-purpose computing devices can be hard-wired to perform the operations, techniques, and/or components described herein, or can include digital electronic devices such as one or more application-specific integrated circuits (ASICs) or field programmable gate arrays (FPGAs) that are persistently programmed to perform the operations, techniques and/or components described herein, or can include one or more hardware processors programmed to perform such features of the present disclosure pursuant to program instructions in firmware, memory, other storage, or a combination. Such special-purpose computing devices can also combine custom hard-wired logic, ASICs, or FPGAs with custom programming to accomplish the technique and other features of the present disclosure. The special-purpose computing devices can be desktop computer systems, portable computer systems, handheld devices, networking devices, or any other device that incorporates hard-wired and/or program logic to implement the techniques and other features of the present disclosure.

The one or more special-purpose computing devices can be generally controlled and coordinated by operating system software, such as iOS, Android, Blackberry, Chrome OS, Windows XP, Windows Vista, Windows 7, Windows 8, Windows Server, Windows CE, Unix, Linux, SunOS, Solaris, VxWorks, or other compatible operating systems. In other embodiments, the computing device can be controlled by a proprietary operating system. Operating systems control and schedule computer processes for execution, perform memory management, provide file system, networking, I/O services, and provide a user interface functionality, such as a graphical user interface ("GUI"), among other things.

Figure 1:
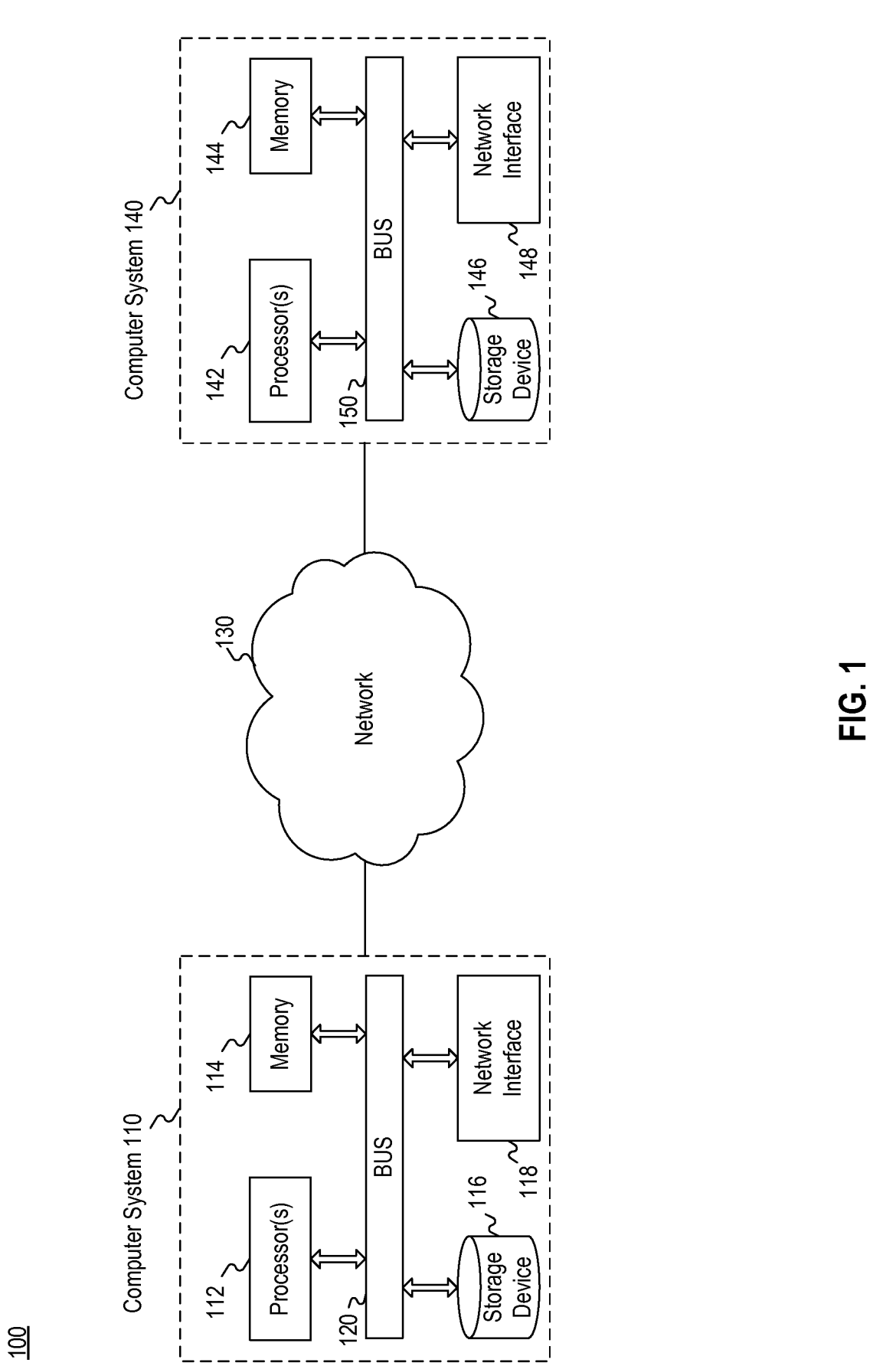
FIG. 1 is a block diagram of an exemplary network system with which embodiments of the present disclosure can be used.

FIG. 1 is a block diagram of an exemplary system 100 with which embodiments described herein can be used. As shown in FIG. 1, system 100 includes a first computer system 110, a network 130, and a second computer system 140. First computer system 110 includes one or more processors 112, a memory device 114, a storage device 116, and a network interface 118, all of which can communicate with each other via a bus 120. Through network 130, first computer system 100 can exchange data with a second computer system 140. Second computer system 140 also includes one or more processors 142, a memory device 144, a storage device 146, and a network interface 148, all of which can communicate with each other via a bus 150.

Both memories 114 and 144 can be a random access memory (RAM) or other volatile storage devices for storing information and instructions to be executed by, respectively, processors 112 and 142. Memories 114 and 144 also can be used for storing temporary variables or other intermediate information during execution of instructions to be executed by processors 112 and 142. Such instructions, after being stored in non-transitory storage media accessible to processors 112 and 114 (e.g., storage devices 116 and 146), render computer systems 110 and 140 into special-purpose machines that are customized to perform the operations specified in the instructions. The instructions can be organized into different software modules, which can include, by way of example, components, such as software components, object-oriented software components, class components and task components, processes, functions, fields, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other tangible medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

Computer systems 110 and 140 can implement the techniques described herein using customized hard-wired logic, one or more ASICs or FPGAs, firmware and/or program logic which in combination with the computer system causes or programs computer systems 110 and 140 to be a special-purpose machine. According to some embodiments, the operations, functionalities, and techniques and other features described herein are performed by computer systems 110 and 140 in response to processors 112 and 142 executing one or more sequences of one or more instructions contained in, respectively, memories 114 and 144. Such instructions can be read into memories 114 and 144 from another storage medium, such as storage devices 116 and 146. Execution of the sequences of instructions contained in memories 114 and 144 cause respectively processors 112 and 142 to perform the process steps described herein. In alternative embodiments, hard-wired circuitry can be used in place of or in combination with software instructions.

The term "non-transitory media" as used herein refers to any non-transitory media for storing data and/or instructions that cause a machine to operate in a specific fashion. Such non-transitory media can comprise non-volatile media and/or volatile media. Non-volatile media can include, for example, optical or magnetic devices, such as storage devices 116 and 146. Volatile media can include dynamic memory, such as memories 114 and 144. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Network interfaces 118 and 148 can provide a two-way data communication coupling to network 130. For example, network interfaces 118 and 148 can be an integrated services digital network (ISDN) card, cable modem, satellite modem, or a modem to provide a data communication connection to a corresponding type of telephone line. As another example, network interfaces 118 and 148 can be a local area network (LAN) card to provide a data communication connection to a compatible LAN. Wireless links can also be implemented. In any such implementation, network interfaces 118 and 148 can send and receive electrical, electromagnetic or optical signals that carry digital data streams representing various types of information, and provide the data stream to storage devices 116 and 146. Processors 112 and 142 can then convert the data into a different form (e.g., by executing software instructions to compress or decompress the data), and then store the converted data into the storage devices (e.g., storage devices 116 and 146), and/or transmit the converted data via network interfaces 118 and 148 over network 130.

Figure 2:
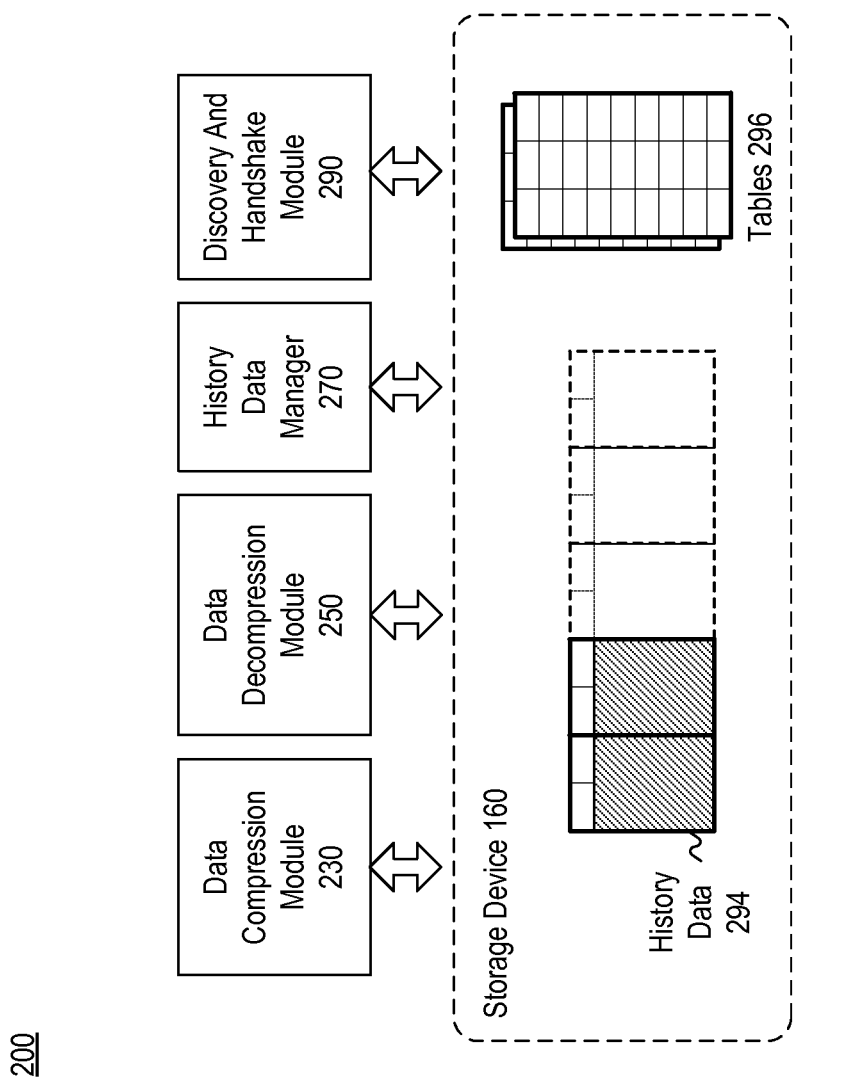
FIG. 2 is a block diagram depicting an exemplary system with which embodiments of the present disclosure can be implemented.

FIG. 2 is a block diagram depicting an exemplary system 200 with which embodiments of the present disclosure can be implemented. In some embodiments, system 200 can be implemented as system 110 of FIG. 1 and includes data compression module 230, data decompression module 250, history data manager 270, and discovery and handshake module 290, at least some of which, when executed by a processor (e.g. processor 112 of FIG. 1), can retrieve and/or update history data 294 and one or more tables 296 stored in storage device 160. Although FIG. 2 shows that system 200 includes both data compression module 230 and data decompression module 250, it is understood that system 200 can include only data compression module 230 to compress data, while a recipient system (e.g. system 140 in FIG. 1) can include only data decompression module 250 to receive the compressed data from system 200, and then decompress it. Moreover, although FIG. 2 shows that history data 294 and tables 296 are two separate entities, it is understood that both can be part of a data structure.

History data 294 includes data that is recently compressed and/or data that is recently generated as a result of decompressing other data, while tables 296 include information that can facilitate a search for a piece of data within history data 294. In some embodiments, history data 294 includes data which system 200 expects to be redundant for a particular transmission. For example, when system 200 receives an instruction to transmit data to the recipient system (e.g. system 140 in FIG. 1), it may expect that at least part of the data to be transmitted is already part of corresponding history data stored in system 140, hence rendering this part of the data redundant and obviating the need to transmit the redundant data. Using information from tables 296, system 200 can search for and locate the redundant data within history data 294. After locating the redundant data, and knowing that system 140 also stores the same redundant data, system 200 can then transmit, to system 140, information indicating a relationship between the redundant data and history data 294 (and/or the corresponding history data stored in system 140). Such a relationship can be, for example, a location and size of the redundant data in the corresponding history data stored in system 140. Such a relationship typically can be expressed with much less data than the redundant data itself. Therefore, the transmission of the relationship information, instead of the redundant data, can conserve the bandwidth of the medium (e.g., network 130 of FIG. 1) over which the transmission occurs. System 200 can also compress the information to further reduce the volume of data to be transmitted. Further details about history data 294 and tables 296 will be discussed below.

Data compression module 230 can receive raw data (e.g., from another application executed by processor 112 of FIG. 1) and an instruction to compress the raw data. Data compression module 230 can then look for the raw data in history data 294 using information from tables 296. Portions of history data 294 can be stored in the memory (e.g. memory device 114 of FIG. 1) and/or in storage device (e.g. storage device 116 of FIG. 1). If the data compression module 230 finds the raw data in history data 294, data compression module 230 can generate a reference token which includes information to assist the recipient system to find the same piece of raw data in its corresponding history data. The information included in the reference token can indicate a location within history data 294, as well as a length of the data which matches the raw data. The reference token can then be transmitted to the receiving system. On the other hand, if data compression module 230 cannot find the raw data in history data 294, the raw data will be transmitted as part of raw tokens to the receiving system. The raw tokens and reference tokens can then be used to form a token stream. In some embodiments, the input data can also be added to history data 294, and tables 296 can be updated with information for locating the added input data in the updated history data 294. In some embodiments, the token stream can be compressed using one or more lossless data stream compression algorithms, before being transmitted. In some embodiments, the token stream (compressed or not) can also be packetized via, for example, network interface 118 of FIG. 1, and the packetized token stream can then be transmitted over a network (e.g. network 130 of FIG. 1). Data compression module can also add the raw data to history data 294, and update tables 296 with the information for locating the added data in the updated history data 294.

Data decompression module 250 can reconstruct a data stream from the token stream transmitted by data compression module 230. After receiving and de-multiplexing the packetized data to retrieve the data packets containing reference and/or raw tokens (and decompressing the de-multiplexed data if the data is compressed) to obtain the token stream, data decompression module 250 can identify the reference tokens and/or raw tokens from the token stream. With each identified reference token, data decompression module 250 can retrieve the data associated with the reference token from history data 294 based on the location and length information of the reference token, and add the retrieved data to an output data stream meant for, for example, another application executed on processors 112. For the raw tokens, data decompression module 250 can add the raw data included in the raw tokens into the output data stream. Data decompression module 250 can also update history data 294 to include the output data stream, and update tables 296 with the information for locating the added data in the updated history data 294.

History data manager 270 manages the creation and deletion of history data 294, on top of the updating by data compression module 230 and data decompression module 250. For example, history data manager 270 can delete some of the history data 294 which is old to make room for new history data. History data manager 270 can also synchronize with the recipient system, or other system from which system 200 receives data, about the changes in the history data, so that both sides involved in the transmission of the token streams have the same history data. Exemplary embodiments for methods and systems of compression history data synchronization and management are described in U.S. Provisional Patent Application No. 61/926,145, titled Method and Apparatus for Compression History Data Synchronization, filed on Jan. 10, 2014, the entire content of which is incorporated herein by reference for all purposes.

Discovery and handshake module 290 can determine whether a communication peer supports the methods of compression and/or decompression consistent with embodiments of the present disclosure. The determination may include, for example, whether the peer includes a data compression module 230 and/or data decompression module 250 and is capable of processing (and/or transmitting) reference tokens and raw tokens according to embodiments of the present disclosure. Exemplary embodiments for methods and systems for compression device handshake and discovery are described in U.S. Provisional Patent Application No. 61/926,158, titled Method and Apparatus for Compression Device Discovery and Handshake, filed on Jan. 10, 2014, the entire content of which is incorporated herein by reference for all purposes.

Figure 3A:
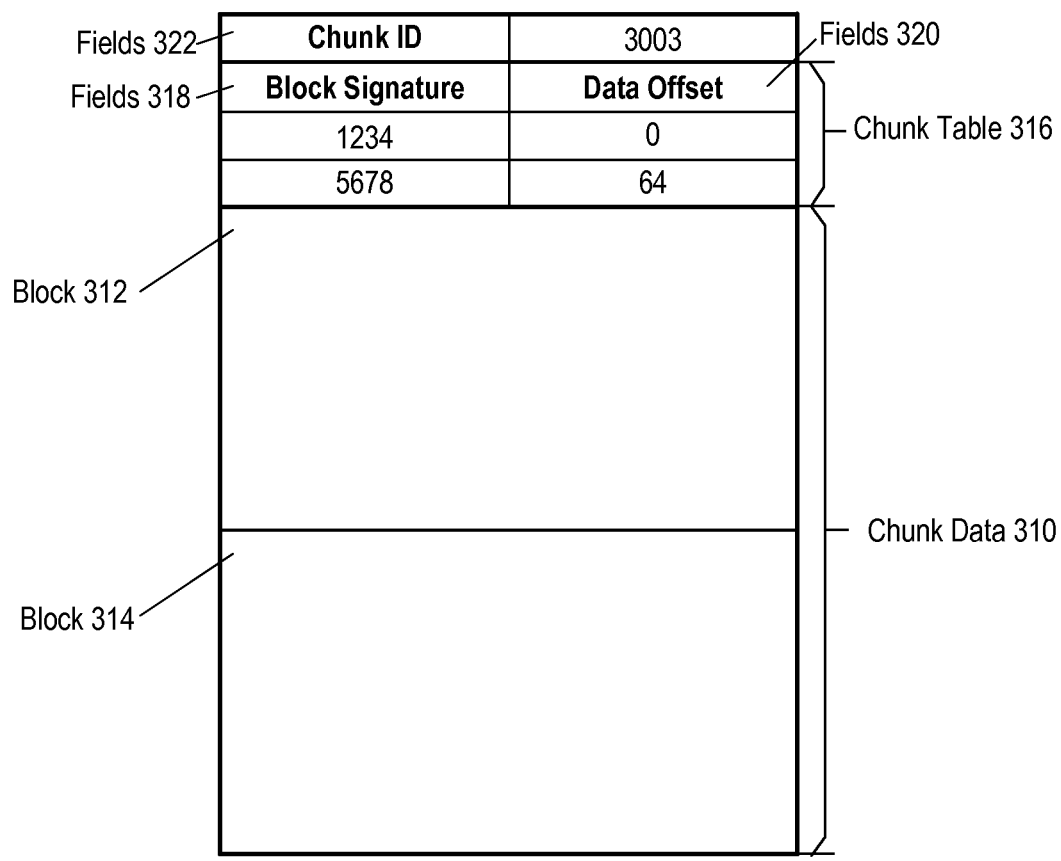

FIG. 3A is a block diagram illustrating an exemplary data chunk structure 300 for facilitating searching of history data according to embodiments of the present disclosure. In some embodiments, history data (e.g. history data 294 of FIG. 2) can be organized into one or more data chunks, each data chunk being represented by a data chunk structure 300. A data chunk structure 300 can be stored in either a memory (e.g. memory 114 of FIG. 1), and/or in a storage device (e.g. storage device 116 of FIG. 1). As to be discussed later, a data chunk structure can be swapped out of memory into a storage device, or vice versa. Each data chunk structure 300 includes chunk data 310, which can include one or more data blocks 312 and 314. A block can refer to a unit of data size adopted by all devices supporting the methods of compression and/or decompression consistent with embodiments of the present disclosure. For example, a block size can be of 64 byte. The block size can be any number.

Data chunk structure 300 is also associated with a chunk table 316. Although FIG. 3A shows that chunk table 316 is part of data chunk structure 300 and next to data blocks 312 and 314, it is understood that chunk table 316 needs not be stored in the same location as the data blocks. In some embodiments, chunk table 316 can be part of tables 296 of FIG. 2 and include information for locating a piece of data within data chunk structure 300. Such information can include an identifier used to identify the piece of data, and the location of the data within data chunk structure 300. As shown in FIG. 3A, chunk table 316 includes fields 318 to store a block signature, which is generated to represent the content of a particular block of data. For example, a block signature of "1234" is associated with data block 312. Besides, a block signature of "5678" is associated with data block 314. Further details about the generation of block signatures will be discussed below.

Chunk table 316 also includes fields 320 to store a data offset, in bytes, which is associated with the location of the particular blocks of data within data chunk structure 300. Since data block 312 is the first data block within data chunk structure 300, the data offset associated with data block 312 can be 0. Data block 314 is stored next to data block 312 within the data chunk structure. In this particular example, the size of data block 312 is 64 bytes, therefore the data offset associated with data block 314 is 64 (bytes). Data chunk structure 300 further includes fields 322 which can be used to associate a particular data chunk structure 300 with a chunk identifier (ID). The chunk ID is identical across systems which store the same data chunk for the history data, and uniquely identifies the data chunk. Based on a known block signature, a piece of data can be efficiently located (or determined to be absent) within a particular data chunk structure, by looking for one or more block signatures that match the known signature. Although not shown in FIG. 3A, each data chunk structure 300 can also be associated with a timestamp, and a search can start on a data chunk structure, designated as the working history data chunk, which is most recently updated.

FIG. 3B is a block diagram illustrating an exemplary memory chunk table 350 for facilitating searching of history data according to embodiments of the present disclosure. Memory chunk table 350 can facilitate a search for a piece of data among each of the history data chunks (e.g. as stored according to data chunk structure 300 of FIG. 3A) currently stored in a volatile memory (e.g. memory 114 of FIG. 1). As shown in FIG. 3B, memory chunk table 350 includes fields 352 to store chunk IDs where each chunk ID identify a data chunk structure in the memory. For each data chunk structure identified by fields 352, memory chunk table 350 further includes fields 354 and 356 to associate, respectively, a block signature that represent a particular data block, and the location of that data block, within the data chunk structure. Based on a known signature, a piece of input data can be efficiently located (or determined to be absent) among a set of data chunk structures stored in a memory, by looking for one or more block signatures that matches the known signature. If the input data is located in a particular data chunk structure, the chunk ID associated with that particular data chunk structure and the location of the data within that data chunk structure can be retrieved. In some embodiments, the retrieved chunk ID and location information can be used for a second, and more refined, search, as to be discussed in detail below. Whether or not such a second search is needed depends on how the block signature is calculated—if the block signature cannot uniquely identify the data (i.e. different data values can generate the same block signature), a second search may be needed to ensure that the data blocks located within that data chunk structure are truly identical to the input data, such that a reference token generated henceforth accurately represents the input data.

Figure 3C:
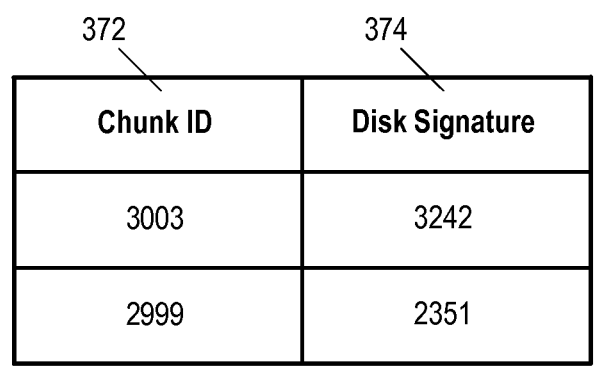

FIG. 3C is a block diagram illustrating an exemplary disk chunk table 370 for facilitating searching of history data according to embodiments of the present disclosure. Disk chunk table 370 can facilitate a search for a piece of data among each of the history data chunks (e.g. as stored according to data chunk structure 300 of FIG. 3A) currently stored in a non-volatile storage device (e.g. storage device 116 of FIG. 1). As shown in FIG. 3C, disk chunk table 370 includes fields 372 to store chunk ID, where each chunk ID identify a data chunk structure representing a chunk of data in the storage device. For each data chunk structure identified by fields 372, disk chunk table 370 further includes fields 374 to store a disk signature, which is generated to represent the content of multiple data blocks stored in the storage device.

In some embodiments, tables 316, 350 and 370 provide a hierarchical structure for search of history data organized as data chunk structures 300 (hereinafter "history data chunks"). To locate a piece of data in the history data, the search can start with the most recent history data chunk currently that is loaded into the memory (designated as the working history data chunk), by looking up for one or more blocks with block signatures matching with the signatures of the data, based on table 316 associated with the working history data chunk. If the data cannot be found, the scope of the search can then be expanded to every history data chunk currently being loaded into the memory, based on the information from table 350. It can be desirable to first confine the search within the memory for a few reasons. First, it is more likely that the data stored in the memory includes the latest update (e.g., with data added as a result of compression or decompression), and therefore the likelihood of finding the piece of data can become higher. Second, accessing data from the memory is also typically faster than accessing data from the storage device, which speeds up the search. Therefore, the search can start with the history data chunks currently stored in the memory.

If the piece of data cannot be located in the memory, the search can then be performed at the history data chunks stored in the storage device with information from table 370. If a match is found based on the disk signature, the history data chunk with a chunk ID associated with the matching disk signature can be loaded into the memory, and a more refined search based on block signatures can then be conducted on newly-loaded history data chunk using information from the associated table 316.

Figure 4A:
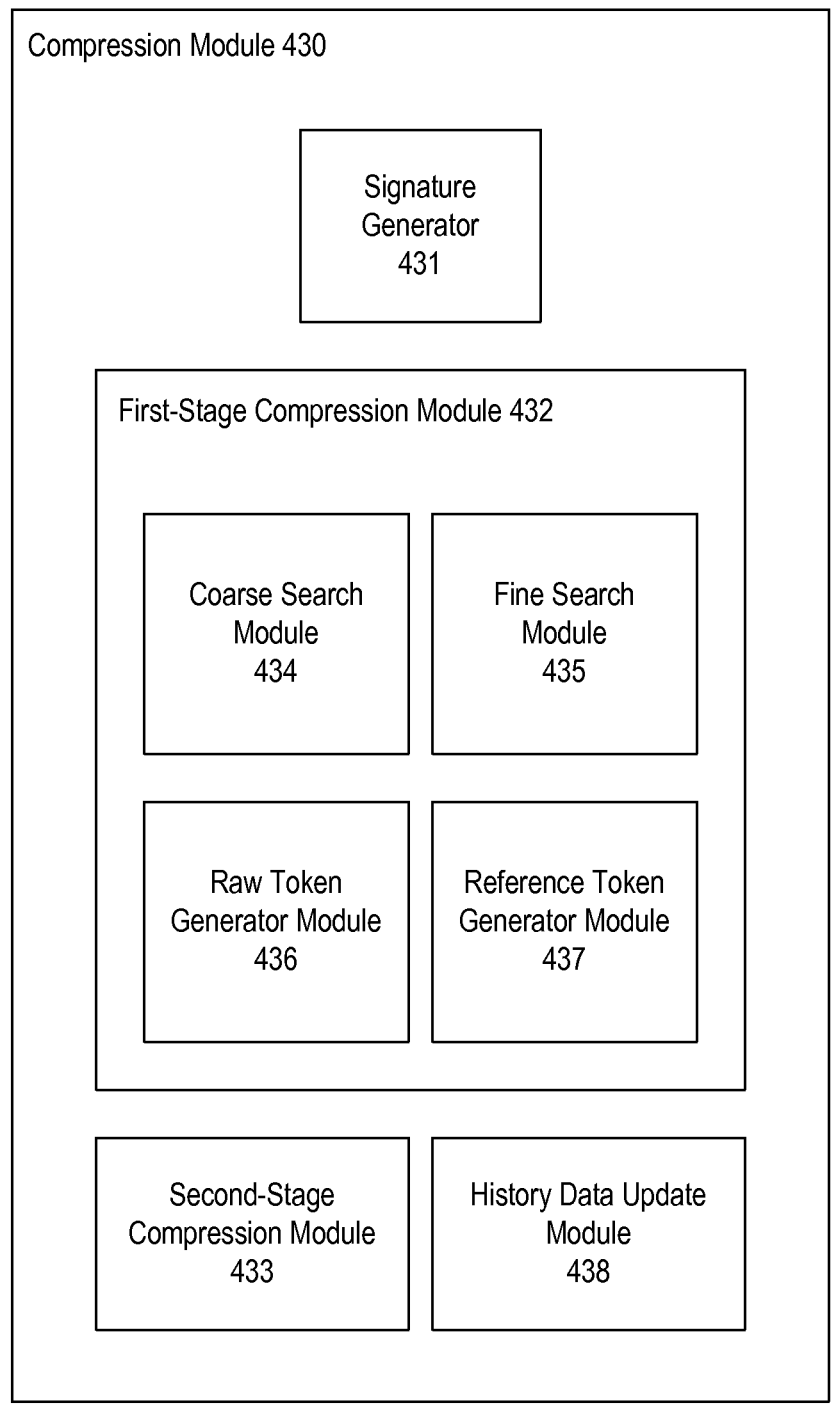
FIG. 4A is a block diagram illustrating an exemplary compression module according to embodiments of the present disclosure.

FIG. 4A is a block diagram illustrating an exemplary compression module 430 according to embodiments of the present disclosure. In some embodiments, compression module 430 provides functionalities similar to those of data compression module 230 of FIG. 2. Compression module 430 includes a signature generator 431, a first-stage compression module 432 and a second-stage compression module 433. First-stage compression module 432 further comprises a coarse search module 434, a fine search module 435, a raw token generator module 436, and a reference token generator module 437.

As compression module 430 receives input data, the data can be processed by signature generator 431 to generate one or more block signatures, where a block signature is associated with each consecutive data block with size of, for example, 64 bytes. Further details about the generation of block signatures will be discussed below.

After at least a block signature is generated for the input data, the generated block signature and the input data can be passed to coarse search module 434 of first-stage compression module 432. Based on the generated block signature, the coarse search module can search for a matching block signature at a particular history data chunk (for example, the working history data chunk) based on, for example, information from the chunk table 316 associated with the working history data chunk. In some embodiments, coarse search module can perform a hierarchical search of the history data chunks stored in the memory and in the storage device using information from, for example, tables 316, 350, and 370 of FIGS. 3A-3C. If a match is found, which may indicate a high likelihood that an exact copy of the input data (or portion thereof) can be found in the working history data chunk, the input data and the data offset associated with the data block with the matching block signature, within the working history data chunk, can then be passed to fine search module 435.

At fine search module 435, a more precise search for the input data within the working history data chunk can be carried out. In some embodiments, such a search may be conducted to ensure that the data blocks located within that working history data chunk are truly identical to the input data. Based on the data offset, fine search module 435 can read the data block, and carry out an exact byte-string comparison against the input data, to make sure that the input data matches exactly with the data block. Fine search module 435 can also expand the scope of comparison in both forward and backward directions, by reading data blocks (or portions thereof) from the working history data chunk in front of and behind the location indicated by the data offset, in order to maximize the number of data blocks that match with a portion of the input data of the same size. After locating the maximum number of matching data blocks within the working history data chunk, the corresponding portion of the input data can be represented by a reference token which indicates the location and the number of matching data block (or a length of the matching data as part of the data blocks) within the history data chunk. In some embodiments, the reference token also includes the chunk ID associated with the working history data chunk. The reference token can be generated by reference token generator module 437 and added to a token stream representing the input data.

On the other hand, for the portion of the input data where either coarse search module 434 fails to find a matching block signature, or fine search module 435 fails to find a piece of data that matches exactly that portion of the input data despite the fact that a matching block signature was found, such a portion of the input data will then be represented by raw tokens. In some embodiments, raw tokens include a copy of that portion of input data. The raw token can be generated by raw token generator module 436 and added to the token stream representing the input data. In some embodiments, compression module 430 further includes a history data update module 438, which adds the input data to the history data accessible by compression module 430, and updates at least one of memory chunk table 350 and disk chunk table 370 with the block and/or disk signatures generated for the input data.

After first-stage compression module 432 generates at least one token for the token stream, the generated token stream can then be passed to second-stage compression module 433 to further compress the token stream. In some embodiments, second-stage compression module 433 can employ a loseless data stream compression algorithm to carry out the compression. The compressed token stream can then be used to represent the input data in a compressed state.

Figure 4B:
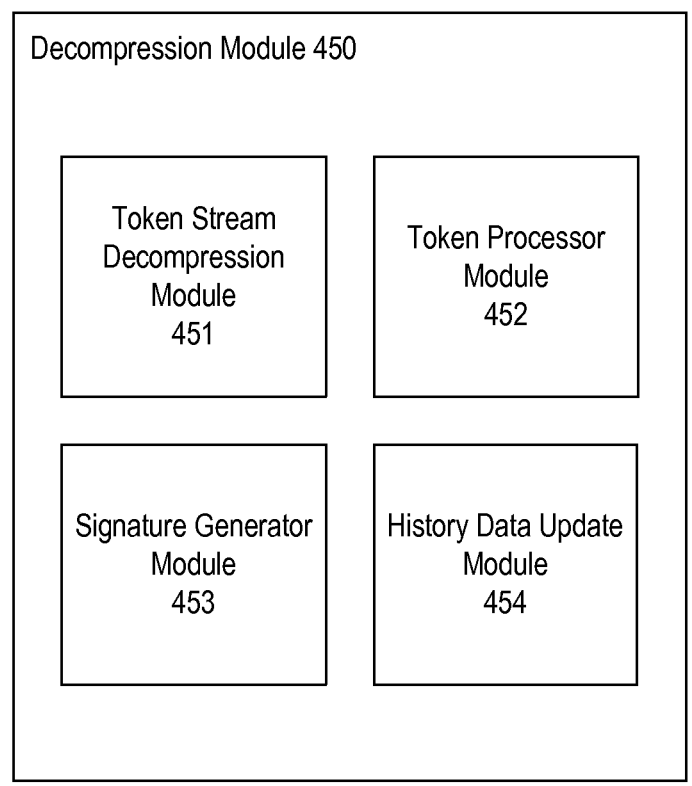
FIG. 4B is a block diagram illustrating an exemplary decompression module according to embodiments of the present disclosure.

FIG. 4B is a block diagram illustrating an exemplary decompression module 450 according to embodiments of the present disclosure. In some embodiments, decompression module 450 provides functionalities similar to those of data decompression module 250 of FIG. 2. Decompression module 450 includes a token stream decompression module 451, a token processor module 452, a signature generator module 453, and a history data update module 454. Token stream decompression module 451 can receive a compressed token stream from, for example, compression module 430, and perform decompression according to the compression algorithm employed by second-stage compression module 433 of compression module 430, to recover the token stream. The recovered token stream can then be processed by token processor module 452, which can identify one or more reference tokens and/or raw tokens from the token stream. With reference tokens, token processor module 452 can locate a working history data chunk (e.g. the chunk that is most recently updated, or a chunk identified by the chunk ID information transmitted as part of the reference token) from the history data accessible by decompression module 450 and, based on the location information and size of matching data information included in the reference tokens, extract the portion of history data represented by the reference tokens. Token processor module 452 can also retrieve the portion of input data (provided to compression module 430) included in the raw tokens. Based on the token stream, token processor module 452 can then reconstruct a data stream that is identical to the input data. The reconstructed data stream can then be passed to signature generator module 453, which generates block and/or disk signatures for the reconstructed data stream. History data update module 454 can also add the reconstructed data stream to the history data accessible by the decompression module 450, so that it matches with the history data accessible by compression module 430, and updates at least one of memory chunk table 350 and disk chunk table 370 with the block and/or disk signatures generated for the reconstructed data.

Figure 5:
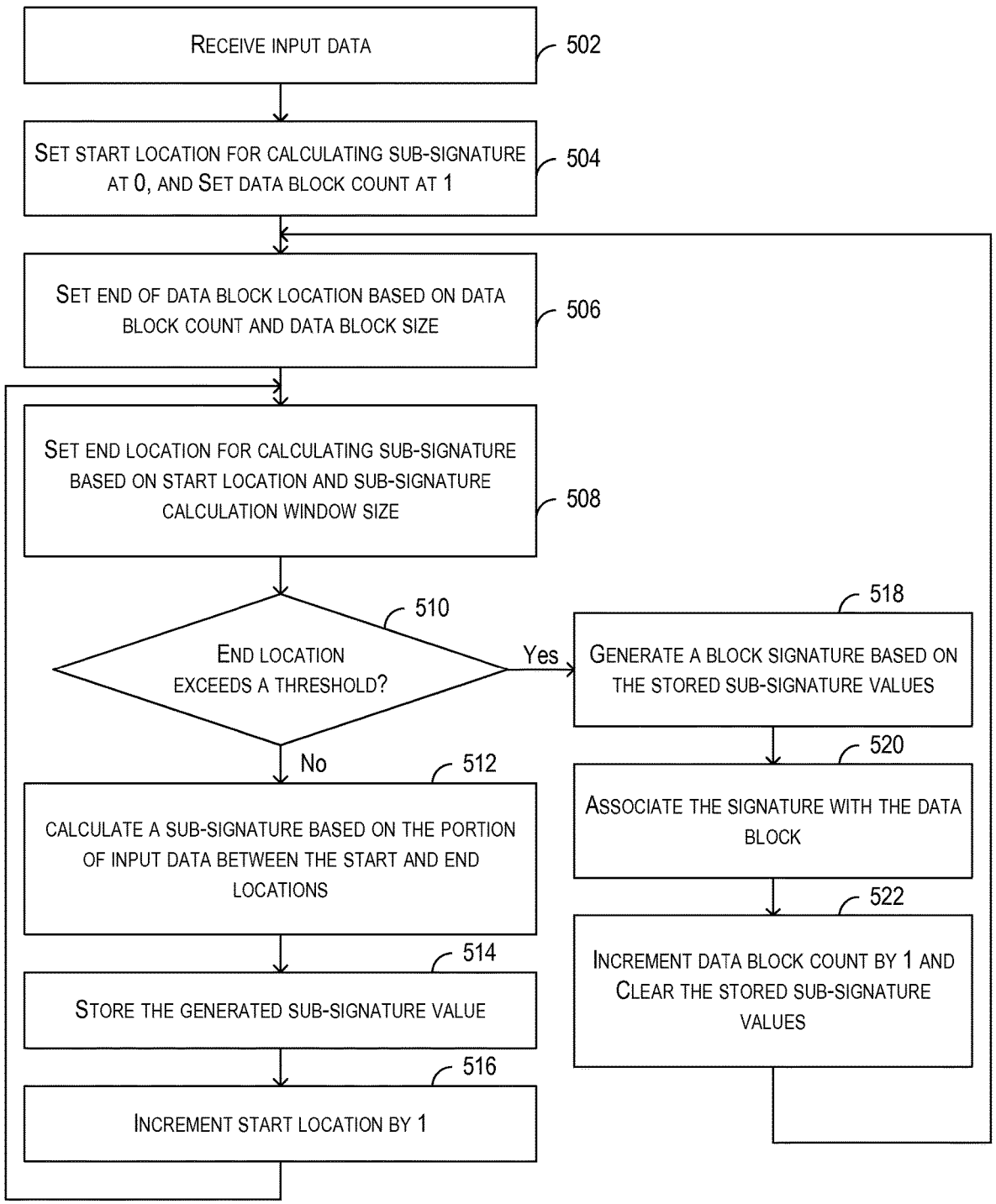
FIG. 5 is a flowchart illustrating an exemplary method of generating block signatures associated with a piece of data, according to embodiments of the present disclosure.

FIG. 5 is a flowchart illustrating an exemplary method 500 of performed by an electronic device for generating block signatures associated with a piece of data according to embodiments of the present disclosure. In this exemplary illustration, the electronic device (e.g., computer system 110 of FIG. 1) receives an input data stream which includes one or more data blocks, calculates one or more sub-signatures using a sliding window within each data blocks, and generates a signature for each data block based on the sub-signatures. While the flowchart discloses the following steps in a particular order, it will be appreciated that at least some of the steps can be moved, modified, or deleted where appropriate, consistent with the teachings of the present disclosure. And while the following steps are indicated as being performed by an electronic device, it is appreciated that the steps can be performed by more than one electronic device.

In step 502, the electronic device receives an input data stream. The data stream can come from any source (e.g. a data stream to be compressed by compression module 430 of FIG. 4A or reconstructed by decompression module 450 of FIG. 4B), and includes one or more data blocks, with each data block including multiple bytes of data.

In step 504, the electronic device sets start location for calculating the sub-signature at zero, which means the processing will starts at the first byte of the input data. The electronic device also sets the value of data block count to one, which indicates that the block signature of the first data block of the input data is generated.

In step 506, the electronic device sets end of data block location based on data block count and data block size. The end of data block location, together with the data block count, defines a master window of input data (which equals to the number of data bytes in one data block) from which the block signature is to be generated.

In step 508, the electronic device sets the end location for calculating sub-signature based on the start location and sub-signature calculation window size. In some embodiments, the sub-signature calculation window size is smaller than the data block size, so that multiple sub-signatures can be generated within one data block. In some embodiments, the sub-signature calculation window size may extend over to a neighboring data block, so that the generated sub-signature (and the signature generated thereof) can better represent the data, which can further improve the accuracy of the search performed by coarse search module 434.

In step 510, the electronic device determines whether the end location for calculating sub-signature exceeds a threshold. This threshold can be any location within the chunk and can be updated for each round of signature generation. If this is not the case, the electronic device will proceed to step 512 to calculate a sub-signature based on the data within the sub-signature calculation window. Various methods can be employed to calculate the sub-signature, such that the sub-signature provides a good representation of the data within the window. For example, conventional methods can be used to generate digital signatures/sub-signatures from the data to be associated with the signatures/sub-signatures.

After the sub-signature is calculated, the electronic device can then proceed to store the sub-signature in step 514, increment the start location by one in step 516, and go back to step 508 again to update the end location for the sub-signature calculation. With such an arrangement, a sliding window for sub-signature calculation is created, and the window slides by one byte for each iteration, until the sub-signature calculation window exceeds the boundary of the current data block, as indicated by end location for calculating sub-signature exceeds the end of data block location. When this occurs, the electronic device will proceed to step 518.

In step 518, the electronic device generates a block signature based on the stored sub-signature values generated in iterations of step 512. Various methods can be used to generate the block signature from the sub-signatures. For example, a hash algorithm can be employed to calculate the block signature based on the sub-signatures; a particular sub-signature can also be chosen among the generated sub-signatures (e.g. by choosing the one with the largest value) as the block signature.

In step 520, the electronic device associates the block signature with the data block. There are different methods of performing the association. For example, the electronic device can update a table similar to the chunk table 316 of FIG. 3 to map the signature with an offset measured, either in bytes or in block size, with respect to the start of the input data.

In step 522, after the electronic device associates the block signature with the data block, the electronic device can then increment data block count by one to indicate that the next data block is processed to generate the next block signature. Optionally, electronic device can also clear the stored sub-signature values, before the electronic device proceeds back to step 506 to start generating new sub-signatures for the next data block.

Figure 6:
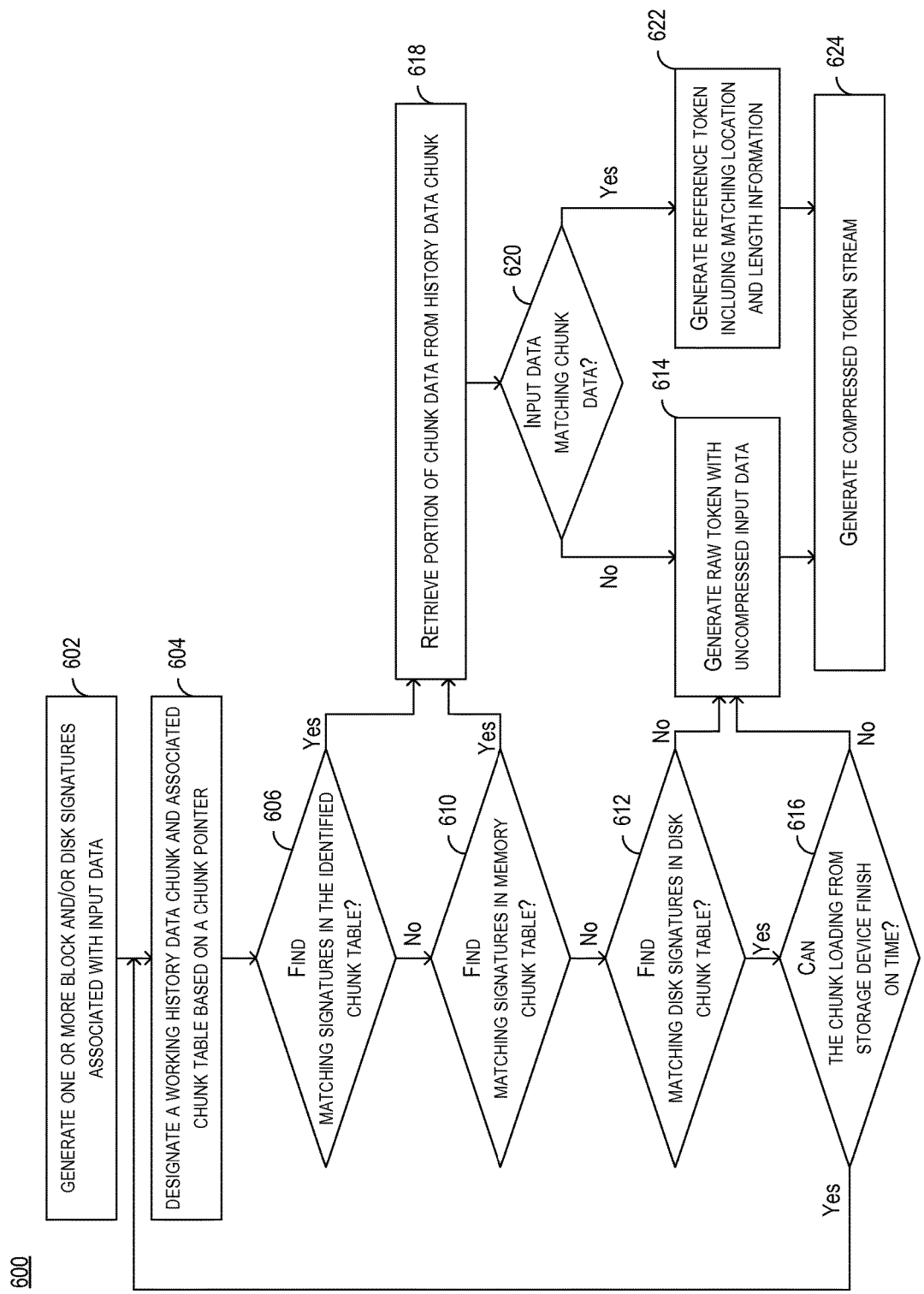
FIG. 6 is a flowchart illustrating an exemplary method of compressing data according to embodiments of the present disclosure.

FIG. 6 is a flowchart illustrating an exemplary method 600 of compressing data according to embodiments of the present disclosure. In this exemplary illustration, the electronic device (e.g., computer system 110 of FIG. 1), executing a compression module (e.g. compression module 430 of FIG. 4A), receives an input data stream and generates token stream to represent the input data. While the flowchart discloses the following steps in a particular order, it will be appreciated that at least some of the steps can be moved, modified, or deleted where appropriate, consistent with the teachings of the present disclosure. And while the following steps are indicated as being performed by an electronic device, it is appreciated that the steps can be performed by more than one electronic device.

In step 602, the electronic device generates one or more block and/or disk signatures associated with input data. The generation can be performed by signature generator 431 of compression module 430, with a method similar to method 500 of FIG. 5.

In step 604, the electronic device identifies a working history data chunk from history data. The working history data chunk can include similar structure as data chunk structure 300 and is associated with a timestamp, and the working history data chunk can be identified based on the timestamp (e.g., most recently updated). The history data chunk can also be associated with chunk table 316 which includes a mapping between block signatures and data offset as shown in FIG. 3A.

In step 606, electronic device searches for one or more block signatures listed in chunk table 316 that match with the block signatures of input data. If a matching signature cannot be found, electronic device can proceed to step 610 to search for all the history data chunks currently stored in the memory to look for a history data chunk with block signatures that match with those of the input data, using information from, for example, memory chunk table 350 of FIG. 3B. If none of the memory data chunk contains a matching block signature, the electronic device can proceed to step 612 to search for the history data chunks currently stored in the storage device to look for a history data chunk with disk signatures that match with those of the input data. If no matching disk signature can be found at step 612, the electron device can proceed to step 614 to generate raw token which includes the uncompressed input data. If a matching disk signature can be found, the electronic device may attempt to load the history data chunk associated with the matching disk signature from the storage device into memory. If the electronic device determines, in step 616, that the loading of the data chunk from the storage device cannot finish on time (e.g., within a certain threshold time), the electronic device will decide to load the data chunk at a later time (e.g., before the processing of the next piece of input data, so that when step 602 starts again for the next piece of input data, the data chunk has been loaded into the memory), and proceed to step 614 to generate the raw tokens. Otherwise, the electronic device will load the history data chunk from the storage device into memory, and proceed to step 604 to designate it as the working history data chunk on which steps 606 and 610 are to be performed to find matching block signatures. Steps 606 through 612, as well as step 616, can be performed by, for example, coarse search module 434 of FIG. 4A, while step 614 can be performed by, for example, raw token generator module 436 of FIG. 4A.

On the other hand, if a matching block signature is found in the history data chunk (in step 606), or in the memory chunk table (in step 610), this may indicate a high likelihood that the history data chunk includes data that is identical to some or all of the input data. The electronic device can then proceed to step 618 to retrieve portions of chunk data from the working history data chunk based on the data offset associated with the matching block signature, and proceed to step 620 to carry out byte-string comparison between the chunk data and the input data. As part of step 620, the electronic device can also expand the scope of the comparison in both forward and backward directions relative to the data offset. If a matching is found between any portions of the chunk data and the input data, the electronic device can proceed to step 622 to generate reference token which includes the location and length of chunk data, within the history data chunk, that matches with the input data. If they do not match, the electronic device will proceed to step 614 to generate the raw token. Step 618 and 620 can be performed by, for example, fine search module 435 of FIG. 4A, while step 622 can be performed by, for example, reference token generator module 437 of FIG. 4A. The electronic device can then proceed to step 624 to generate a token stream including the raw token and reference token, and can use second-stage compression module 433 of FIG. 4A to further compress the token stream. Although not shown in FIG. 6, the electronic device can also add the input data into the history data, and updates at least one of memory chunk table 350 and disk chunk table 370 with the block and/or disk signatures generated for the input data.

Figure 7:
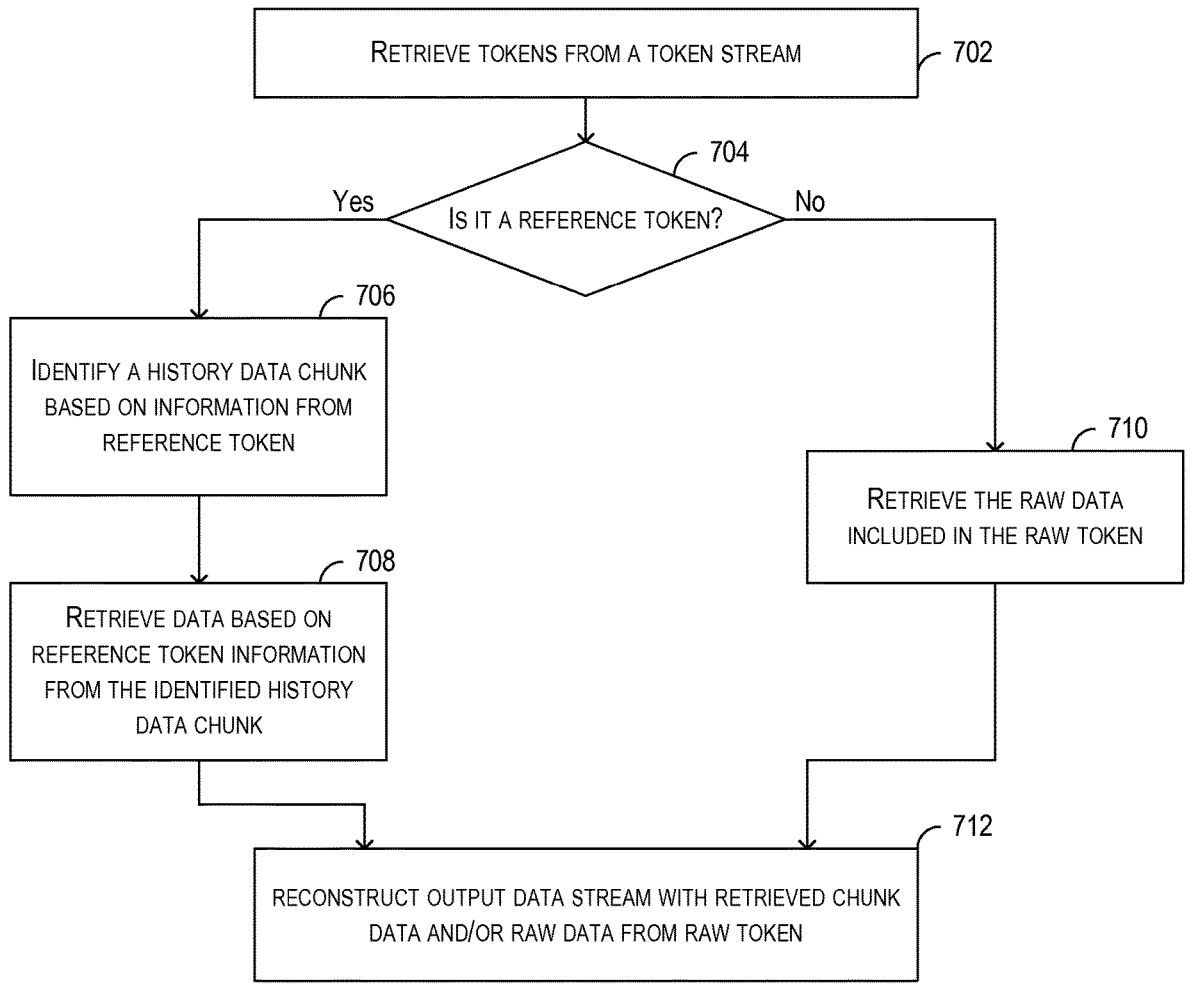
FIG. 7 is a flowchart illustrating an exemplary method of decompressing data according to embodiments of the present disclosure.

FIG. 7 is a flowchart illustrating an exemplary method 700 of decompressing data according to embodiments of the present disclosure. In this exemplary illustration, the electronic device (e.g., computer system 110 of FIG. 1), executing a decompression module (e.g. decompression module 450 of FIG. 4B), receives a token stream representing certain data, and reconstructs a data stream that matches with the data represented by the token stream. While the flowchart discloses the following steps in a particular order, it will be appreciated that at least some of the steps can be moved, modified, or deleted where appropriate, consistent with the teachings of the present disclosure. And while the following steps are indicated as being performed by an electronic device, it is appreciated that the steps can be performed by more than one electronic device.

In step 702, the electronic device retrieves tokens from a token stream. In some embodiments, the token stream may have been compressed (e.g., by second-stage compression module 433 of FIG. 4A), and the electronic device can decompress the compressed stream. Step 702 can be performed by token stream decompression module 451 of FIG. 4B.

The electronic device can proceed to step 704 to determine whether a retrieved token is a reference token, which includes location and length information of a piece of data in the history data chunk that matches the data represented by the reference token, and/or chunk ID that identifies the working history data chunk.

If the token is a reference token, the electronic device can proceed to step 706 to identify the history data chunk. The history data chunk can be identified based on the timestamp associated with it (e.g., the data chunk most recently updated), and/or from the chunk ID stored as part of the reference tokens. After identifying the working history data chunk, the electronic device can then proceed to step 708 to retrieve data, from the identified history data chunk, based on the location and length information of the reference token.

If the token is a raw token, the electronic device can proceed to step 710 to retrieve the raw data included in the raw token. The electronic device can then proceed to step 712 to reconstruct an output data stream using the retrieved chunk data (from step 708) and/or the raw data from raw token (from step 710). Step 706 can be performed by, for example, token processor module 452 of FIG. 4B. Although not shown in FIG. 7, the electronic device can also add the reconstructed data stream into the history data, and updates at least one of memory chunk table 350 and disk chunk table 370 with the block and/or disk signatures generated for the input data.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

What is claimed:

1. An apparatus, comprising:
a memory device that stores first history data, wherein the first history data comprises one or more first data chunks, each first data chunk being associated with one or more first signatures, wherein the one or more first data chunks include a working data chunk which is most recently compressed in the first history data;
a data storage device storing one or more second data chunks, each second data chunk being associated with one or more third signatures; and
at least one processor configured to:
receive input data;
determine a relationship between the first history data and one or more portions of the input data;
generate, based on the relationship, a token stream comprising one or more tokens reflecting the relationship, wherein the one or more tokens comprise at least one of a reference token or a raw token, and wherein the reference token includes a location and length of chunk data within the first history data that matches at least a portion of the input data, and the raw token includes one or more portions of input data not matching any portion of the first history data; and
compress the token stream to form a compressed token stream;
transmit the compressed token stream to a recipient device,
wherein the at least one processor is configured to determine the relationship between the first history data and the one or more portions of the input data by:
associating one or more second signatures with the input data;
determining whether at least one of the first signatures associated with the working data chunk matches with at least one of the second signatures;
responsive to a determination that none of the first signatures matches with any of the second signatures, determining whether at least one of the third signatures matches with at least one of the second signatures;
responsive to a determination that at least one of the third signatures matches with at least one of the second signatures, determining a loading time of the second data chunk associated with the third signature that matches with the second signatures;
responsive to the loading time being less than a threshold time, acquiring the second data chunk associated with the third signature that matches with the second signature from the data storage device to become the working data chunk; and
responsive to the loading time being larger than or equal to the threshold time, generating one or more raw tokens for the second data chunk associated with the third signature that matches with the second signatures.

2. The apparatus of claim 1, wherein the reference token allows a reconstruction of the one or more portions of the input data at the recipient device.

3. The apparatus of claim 1, wherein to determine the relationship between the first history data and the one or more portions of the input data, the at least one processor is configured to determine whether a portion of the input data matches with any portion of the first history data, and wherein the at least one processor is further configured to:
responsive to determining that the portion of the input data does not match with any portion of the first history data, transmit the portion of the input data to the recipient device.

4. The apparatus of claim 1, wherein, responsive to a determination that at least one of the first signatures of the working data chunk matches with at least one of the second signatures, the first signature that matches with the second signature being associated with a portion of the working data chunk and the second signature being associated with a portion of the input data, to determine the relationship between the first history data and the one or more portions of the input data, the at least one processor is configured to:
- determine that the associated portion of the working data chunk is identical to the associated portion of the input data; and
- determine information about a location and a size of the associated portion of the working data chunk that is identical to the associated portion of the input data,
- wherein a first reference token is generated to include the information about the location and the size of the associated portion of the working data chunk.

5. The apparatus of claim 4, wherein the working data chunk further includes one or more data blocks, wherein at least one of the first signatures is associated with at least one of the data blocks and with a first offset, the first offset reflecting the location of the at least one of the data blocks within the working data chunk, and
- wherein to determine the information about a location and a size of the associated portion of the working data chunk, the at least one processor is configured to:
  - search, within the working data chunk and in a forward direction or backward direction relative to the location reflected by the first offset, data that matches with one or more portions of the input data.

6. The apparatus of claim 5, wherein the at least one of the first signatures is generated from a plurality of sub-signatures by applying a hash algorithm on the sub-signatures or by choosing a sub-signature with the largest value, each sub-signature being generated from a portion of the at least one of the data blocks.

7. The apparatus of claim 1, wherein each of the first data chunks is associated with a timestamp, and wherein the working data chunk is designated based on the timestamp associated with the working data chunk.

8. A computer-implemented method for processing data, the method comprising:
- receiving input data;
- receiving first history data, wherein the first history data comprises one or more first data chunks, each first data chunk being associated with one or more first signatures, wherein the one or more first data chunks include a working data chunk which is most recently compressed in the first history data;
- receiving one or more second data chunks from a data storage device, each second data chunk being associated with one or more third signatures;
- determining a relationship between the first history data and one or more portions of the input data;
- generating, based on the relationship, a token stream comprising one or more tokens reflecting the relationship, wherein the one or more tokens comprise at least one of a reference token or a raw token, and wherein the reference token includes a location and length of chunk data within the first history data that matches at least a portion of the input data, and the raw token includes one or more portions of input data not matching any portion of the first history data; and
- compressing the token stream to form a compressed token stream;
- transmitting the compressed token stream to a recipient device,
  - wherein determining the relationship between the first history data and the one or more portions of the input data comprises:
    - associating one or more second signatures with the input data;
    - determining whether at least one of the first signatures matches with at least one of the second signatures;
    - responsive to a determination that none of the first signatures matches with any of the second signatures, determining whether at least one of the third signatures matches with at least one of the second signatures;
    - responsive to a determination that at least one of the third signatures matches with at least one of the second signatures, determining a loading time of the second data chunk associated with the third signature that matches with the second signatures;
    - responsive to the loading time being less than a threshold time, acquiring the second data chunk associated with the third signature that matches with the second signature from the data storage device to become the working data chunk; and
    - responsive to the loading time being larger than or equal to the threshold time, generating one or more raw tokens for the second data chunk associated with the third signature that matches with the second signatures.

9. The method of claim 8, wherein the reference token allows a reconstruction of the one or more portions of the input data at the recipient device.

10. The method of claim 8, wherein the determining of the relationship between the first history data and the one or more portions of the input data includes determining whether a first portion of the input data matches with any portion of the first history data, further comprising:
- responsive to determining that the first portion of the input data does not match with any portion of the first history data, transmitting the first portion of the input data to the recipient device.

11. The method of claim 8, wherein, responsive to a determination that at least one of the first signatures of the working data chunk matches with at least one of the second signatures, the first signature that matches with the second signature being associated with a portion of the working data chunk and the second signature being associated with a portion of the input data, the determination of the relationship between the first history data and the one or more portions of the input data further includes:
- determining that the associated portion of the working data chunk is identical to the associated portion of the input data; and
- determining information about a location and a size of the associated portion of the working data chunk,
- wherein a first reference token is generated to include the information about the location and size of the associated portion of the working data chunk.

12. The method of claim 8, wherein the working data chunk further includes one or more data blocks, wherein at least one of the first signatures is associated with at least one of the data blocks and with a first offset, the first offset indicating the location of the at least one of the data blocks within the working data chunk, and
- wherein the determination of the information about a location and a size of the associated portion of the working data chunk includes:
- searching, within the working data chunk and in a forward direction or backward direction relative to the location reflected by the first offset, data that matches with one or more portions of the input data.

* * * * *